United States Patent
Lamorey et al.

(10) Patent No.: US 7,791,933 B2
(45) Date of Patent: Sep. 7, 2010

(54) OPTIMIZED PHASE CHANGE WRITE METHOD

(75) Inventors: Mark Lamorey, South Burlington, VT (US); Thomas Happ, Dresden (DE)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 11/963,119

(22) Filed: Dec. 21, 2007

(65) Prior Publication Data

US 2009/0161416 A1 Jun. 25, 2009

(51) Int. Cl.
*G11C 11/00* (2006.01)

(52) U.S. Cl. .................. 365/163; 365/100; 365/185.25; 365/203; 365/233.16

(58) Field of Classification Search .................. 365/46, 365/100, 148, 163, 94, 113, 129; 257/2–5, 257/296, E31.047, E27.006; 438/95, 96, 438/365, 482, 486, 597, 29, 166, 259; 977/754
See application file for complete search history.

(56) References Cited

U.S. PATENT DOCUMENTS

| | | | | |
|---|---|---|---|---|
| 5,166,758 | A * | 11/1992 | Ovshinsky et al. | 257/3 |
| 6,314,014 | B1 | 11/2001 | Lowrey et al. | |
| 6,590,807 | B2 * | 7/2003 | Lowrey | 365/175 |
| 6,707,712 | B2 * | 3/2004 | Lowery | 365/175 |
| 6,795,338 | B2 * | 9/2004 | Parkinson et al. | 365/163 |
| 2002/0154531 | A1 | 10/2002 | Lowrey et al. | |
| 2004/0051094 | A1 * | 3/2004 | Ooishi | 257/5 |
| 2004/0225829 | A1 | 11/2004 | Akiyama et al. | |
| 2005/0056877 | A1 | 3/2005 | Rueckes et al. | |
| 2005/0185445 | A1 | 8/2005 | Osada et al. | |
| 2005/0185572 | A1 | 8/2005 | Resta et al. | |
| 2005/0237820 | A1 | 10/2005 | Takemura et al. | |
| 2006/0209585 | A1 * | 9/2006 | Tanizaki et al. | 365/148 |
| 2007/0121376 | A1 * | 5/2007 | Toda | 365/185.2 |

OTHER PUBLICATIONS

U.S. Appl. No. 11/690,451, entitled "Optimized Phase Change Write Method" filed on Feb. 23, 2007, First Named Inventor: Mark Lamorey.

* cited by examiner

*Primary Examiner*—Richard Elms
*Assistant Examiner*—Harry W Byrne
(74) *Attorney, Agent, or Firm*—Scully, Scott, Murphy & Presser, P.C.; Michael J. LeStrange, Esq.

(57) ABSTRACT

A system of writing data to a phase change random access memory (PCRAM) on an integrated circuit (IC), and a design structure including the IC embodied in a machine readable medium are disclosed. The system includes an array of phase change elements with a plurality of devices providing independent control of a row access and a column access to the PCRAM. A column line (bit line) is pre-charged to a single predetermined level prior to enabling current flow to a corresponding selected phase change element. A current flow in the phase change element with a row (word line) is initiated once the column (bit line) has been pre-charged, to write data to the PCRAM cell. The current flow is terminated in the phase change element by closing the column line (bit line) preferably by quenching.

10 Claims, 4 Drawing Sheets

OPTIMIZED PHASE CHANGE WRITE METHOD

This application is related to co-pending and co-assigned U.S. patent application Ser. No. 11/690,451, filed Mar. 23, 2007, currently pending.

FIELD OF THE INVENTION

The invention relates to a system for writing to a phase change random access memory (PCRAM) cell. More particularly, the present invention relates to a write system that minimizes power variations relative to a bit line (BL) position, resistance and capacitance variations, and to a design structure including the write system embodied in a machine readable medium.

BACKGROUND OF THE INVENTION

Phase change random access memory or phase change memory (PCRAM) is a non-volatile memory technology. The PCRAM technology is based on a structure called a PCE (phase change element), which can be envisioned as a programmable resistor. The state of the PCE is set through a heating and cooling process which is controlled electrically using ohmic heating by passing current through the PCE. To program a PCE memory cell (i.e., transform it from amorphous to crystalline or vice versa), a current pulse is sent through the resistor, heating up the phase change (PC) material over its crystallization temperature and thus lowering its resistance. In a reset mode, a high current pulse is applied to the cell, causing the PC material to melt, and during the subsequent quench cooling it is amorphized.

Writing to a PCRAM cell is typically done by heating the element through electrical ohmic heating that occurs while passing a current through the phase change element (PCE). Alternatively, a heating current could be passed through an external heater located in close proximity of the PCE. The magnitude of the heating process can be controlled by either a current source or voltage source. The initiation and duration of the heating process can be controlled via the source, the word line (WL) or the bit line (BL). Each possible control point has its own drawbacks.

Current writing methods typically include activating the word line, then activating the bit line, and then turning off the bit line. However, one of the problems with current writing methods is with rise time, that is, the voltage can be turned off quickly but could not be turned on quickly.

Due to the parasitic capacitance of the BL, initially the cell current, and thus power, is lower than intended, leading to a slower heating of the cell. In addition, the total energy deposited in the PCE varies with its location in the array, which could introduce additional fluctuations and lead to a broader cell distribution.

It would therefore be desirable for a method or system to provide a means for large scale arrays to allow random access of the arrays varying in size, for example, from multiple millions of bits to arrays of hundreds of bits.

SUMMARY OF THE INVENTION

The invention relates to a method of writing data to a phase change random access memory (PCRAM) on an integrated circuit (IC) which comprises gating an array of phase change elements with a plurality of devices providing independent control of a row access and a column access to the PCRAM. A column line (bit line) is pre-charged to a single predetermined level prior to enabling current flow to a corresponding selected phase change element. A current flow is initiated in the phase change element with a row (word line) once the column (bit line) has been pre-charged to write data to the PCRAM cell. The current flow is terminated in the phase change element by closing the column line (bit line).

In a related aspect of the invention, the method further includes quenching the column line (bit line) nearly at the same time as the closing of the column line.

In another related aspect of the invention, a plurality of column lines are pre-charged each to a predetermined level, or pre-charging a plurality of column lines to multiple independent levels for each column line, and terminating the current flow in the phase change element and quenching the bit line independently for each column line.

In another aspect of the invention, a system for writing data to a phase change random access memory (PCRAM) on an integrated circuit (IC) or chip comprises an array of phase change elements with a plurality of devices providing independent control of a row access and a column access to the PCRAM. A voltage source is coupled to the PCRAM and the IC directs the voltage source to pre-charge the column line to a predetermined level prior to the IC enabling a current flow to a corresponding selected phase change element. The IC initiates a current flow in the phase change element with a row (word line) once the column (bit line) has been pre-charged to write data to the PCRAM cell. The IC terminates the current flow in the phase change element by closing the column line.

In a related aspect of the invention, the column line (bit line) is quenched nearly at the same time as the closing of the column line.

In a related aspect of the invention, the IC includes a control element for directing the voltage source and current flow.

In a related aspect of the invention, the voltage source pre-charges a plurality of column lines each to a predetermined level, or may pre-charge a plurality of column lines to multiple independent levels for each column line, and the IC terminates the current flow in a plurality of phase change elements independently for each column.

In another aspect of the invention, a design structure embodied in a machine readable medium is also provided that includes:

an array of phase change element (PCE) cells each including a variable resistor, and a plurality of devices providing independent control of a row access and a column access to the PCRAM;

a voltage source coupled to the PCRAM;

an integrated circuit (IC) directing the voltage source to pre-charge the column line to a predetermined level prior to the IC enabling a current flow to a corresponding selected phase change element;

the IC initiating a current flow in the phase change element with a row (word line) once the column (bit line) has been pre-charged to write data to the PCRAM cell; and the IC terminating the current flow in the phase change element by disconnecting the column line.

In another aspect of the invention, a design structure embodied in a machine readable medium is also provided that includes:

an array of phase change element (PCE) cells each including a variable resistor, and a plurality of devices providing independent control of a row access and a column access to the PCRAM, wherein the PCEs each include a variable resistor and an access transistor;

a voltage source coupled to the PCRAM;

an integrated circuit (IC) directing the voltage source to pre-charge the column line to a predetermined level prior to the IC enabling a current flow to a corresponding selected phase change element, wherein the voltage source pre-charges a plurality of column lines to multiple independent levels for each column line, and the IC terminates the current flow in a plurality of phase change elements independently for each column;

the IC initiating a current flow in the phase change element with a row (word line) once the column (bit line) has been pre-charged to write data to the PCRAM cell;

the IC terminating the current flow in the phase change element by disconnecting the column line; and wherein the IC includes a control element for directing the voltage source and current flow, a column system decoder for controlling the current flow to the corresponding selected phase change element, and a row system element for controlling the current flow in the phase change element with the row (word line) once the column (bit line) has been pre-charged to write data to the PCRAM cell.

BRIEF DESCRIPTION OF THE DRAWINGS

These and other objects, features and advantages of the present invention will become apparent from the following detailed description of illustrative embodiments thereof, which is to be read in connection with the accompanying drawings, in which.

DETAILED DESCRIPTION OF THE INVENTION

Figures 1, 2:
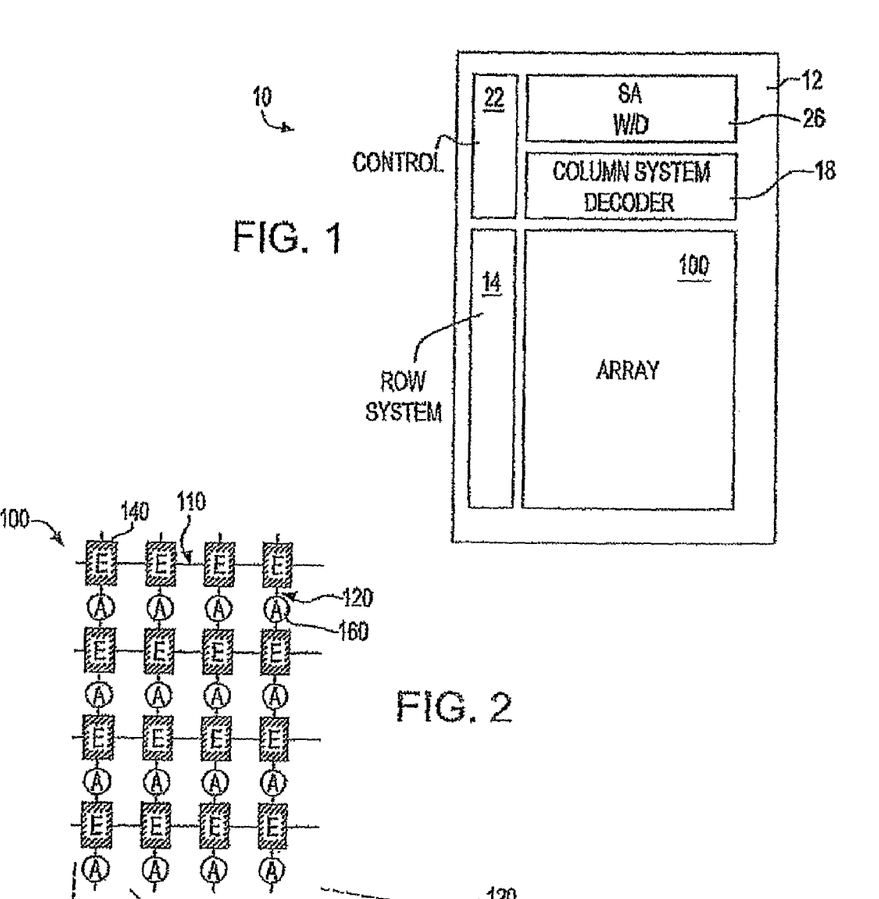
FIG. 1 is a block diagram of an example phase change write system including an array.
FIG. 2 is an example of the architecture of the array shown in FIG. 1 depicting phase change cells and parasitic elements.
Figures 2A, 2B:
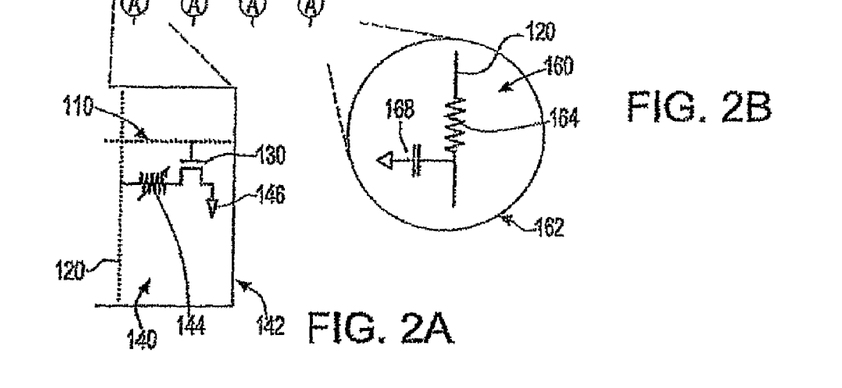
FIG. 2A is a detail view of the phase change (PCE) cells shown in FIG. 2, having a phase change variable resister (PCE) and an access transistor.
FIG. 2B is a detail view of the parasitic element shown in FIG. 2 and a capacitor.

The present invention provides a method and system to design large scale arrays to allow random access of arrays varying in size, for example, from multiple millions of bits to arrays of just hundreds of bits. This can be achieved using an example embodiment of a system as shown in FIGS. 2-2B, which includes an array of PCE (phase change elements) cells 140 gated by an access transistor with a matrix of WL (word lines—typically a poly (silicon) Si gate material) and BL (bit lines—typically a metal interconnect). The current passing through the PCE cell 140 can be controlled via a bit line (BL) and/or word line (WL). A typical method for writing the PCE is to raise the WL of a given device and then apply a voltage or current pulse to the bit line.

The method according to the present invention includes beginning the write cycle by pre-charging one or more bit lines to a set voltage level, then using the word line to begin the write pulse and using the bit line path to terminate the pulse. The inventive method provides independent magnitude and pulse width control of each bit line while allowing a bit line pre-charge.

The writing of a phase change random access memory (PCRAM) memory cell is typically performed by heating the element through electrical ohmic heating that occurs while passing a current through the phase change element (PCE) 140 (shown in FIG. 2-2A). Alternatively, a heating current could be passed through an external heater located in close proximity of the PCE. The magnitude of the heating process can be controlled by either a current source or voltage source. The initiation and duration of the heating process can be controlled via the source, the word line (WL) 110 or the bit line (BL) 120.

A PCE is an element that changes its resistance based upon temperature. When the PCE is heated and cooled slowly the element is transformed into a good conductor and a low resistance state. When the PCE is heated (generally to a higher temperature than for the low resistance transformation) and cooled quickly, also know as quench, the PCE is transformed into a poor conductor having high resistance.

An optimized write control system will deliver a prescribed total power over a given period of time independent of array location and process variations. A preferred write control system includes a write source that applies a voltage to the bit line and pre-charges the bit line KC network for a period of time. Then the WL rises, opening the access transistor and starting the heating process on the PCE. This process is then terminated by shutting off the path from the source over the BL and a discharge device removing the charge from the BL.

Referring to FIG. 1, an embodiment of the optimized phase change write control system 10 on a PCRAM memory, according to the present invention includes an array of PCE cells 100, a row system 14, a column system decoder 18, a control element 22, and a voltage supply element W/D 26 on an integrated circuit (chip) 12. The control element 22 manages the voltage on the chip 12. The circuits on the memory chip can initiate the voltage being controlled by the control element. In the array 100 (shown in FIG. 2), no current flows until both a WL 110 and BL 120 are selected. The voltage supply element 26 on the chip 12 may be a write driver W/D.

The control system 10 enables independent control of the row access and the column access to a PCRAM. The row system drives the word line which then opens up an access transistor 130 (shown in FIG. 2A). The current flow in the phase change element is terminated by closing and electrically quenching the bit line (column line) 120 near simultaneously or simultaneously. Thus, simultaneously or near simultaneously, while the bit line is closed, it is discharged to an alternate power (quenched). This termination can be independent for each column. For example, referring to FIG. 2, the bit line (column lines) 120 may be independently controlled so that if two different bit lines were charging to two different voltages, one bit line can be chosen at one time, and the other bit line at a different time, or if two bit lines are at the same voltage one bit line can be closed one at one time and the other at another time.

Referring to FIG. 2, an example embodiment of the array 100 architecture comprises an array of phase change element (PCE) cells 140 gated by access devices 130 (shown in FIG. 2A) while being connected to a write and read source with independent control of both row (word line)(WL) 10 and column (bit line)(BL) 120 paths. The control element 22 (FIG. 1) is connected to the word line 110 and bit line 120 and is adapted to provide independent control of the word lines and bit lines. The control element 22 (shown in FIG. 1) is connected to the WL 110 and BL 120 row system driver 14 (shown in FIG. 1) and column system decoder 18 (shown in FIG. 1), respectively, (Row System & Column System). Thereby, the WL driver/Row System 14 is connected to the WL 110 and the column system decoder 18 is connected to the bit line 120 (shown in FIG. 2). Parasitic elements 160 are positioned between the PCE cells 140 along the bit line 120. The parasitic may be unavoidable parasitic elements which are, for example, the metal or poly-silicon connection lines used to connect transistors and phase change elements. Metal connection lines are frequently used, and having capacitance, result in a parasitic affect. Thus, the parasitic elements are an unavoidable element of wiring connecting components/elements together.

Referring to FIG. 2A, an example of a PCE cell 140 is shown in detail 142. The PCE cell 140 includes a PCE as a phase change variable resistor 144 and is connected between the bit line 120 and the access transistor 130. An access device, access transistor 130 (which may also be a bi-polar device) is connected to the word line 110, and connected to the variable resistor 144 and a ground 146. Moreover, an example of an access transistor device may be a field effect transistor (FET) 130 which is connected to the word line 110 and connected to the ground 146.

Referring to FIG. 2B, an example of the parasitic element 160 is shown in detail 162. The parasitic element 160 includes a capacitor 168 connected to a resistor 164 in line with the bit line 120.

As can be seen in FIG. 2, the architecture is similar to that of dynamic random access memory, for example, DRAM (Dynamic Random Access Memory), SRAM (Static Random Access Memory), MRAM (Magnetoresistive Random Access Memory), and others. However, in the embodiment according to the present invention, the control element 22 (FIG. 1) enables independent control of the WL 110 and BL 120 paths (shown in FIG. 2). Independent control of the WL 110 and BL 120 path enables opening a single or multiple WL, and also being able at any specified time to open a single or multiple BLs, and to close either a single BL or WL or any combination thereof.

The BL 120 is pre-charged, using voltage supply 26 on the chip 12 (such as a write driver), to a specific level before current flows through the PCE cell 140. Other power supplies (not shown) are off the chip 12 and may be part of a computer system. In the array 100, no current (except leakage current) flows though a PCE cell 140 without a corresponding WL 110 and BL 120 being selected. In the case where a BL or multiple BLs are pre-charged, then the WL will not be selected, thus allowing the BL capacitance to charge up to a specified level. Generally, a read head will read an analog current or voltage and interpret it into a digital value "0" or "1". A write head will read a digital value of "0" or "1" and convert it into an analog current or voltage and timing to be applied to the PCE cell 140.

The word line 110 initiates the current flow through the PCE cell 140 once the BL 120 has reached a predetermined level or a specified period of time has passed. According to the present invention, the BL 120 is pre-charged to a prescribed level, then a WL 110 is selected for a specific power delivery.

The BL terminates the current flow, through the PCE cell by disconnecting the source, and discharges the BL charge through a shorting device. This allows the simultaneous programming of several cells along one WL, since every BL can apply the appropriate voltage levels and pulse durations for either writing a "1" or "0".

In known array organizations, current is not initiated until both a WL and BL are selected. In the array 100 according to the present invention, shown in FIG. 2, when using a PCE element (as well as other memory elements) a different timing exists for a "1" write as compared to a "0" write. In order to achieve different timing, the BLs 120 can be charged to a predetermined level, which may be different for each BL, and then power delivery can be initiated with the WL 110. Power delivery to each bit line 120 can be terminated at different times. Thus, an independent power level and time delivery for each BL is enabled while still allowing each PCE to take advantage of a pre-charged BL for greater control of the power delivery. The invention allows for pre-charging of multiple BLs to multiple predetermined levels, a group common WL initiates power delivery and independent BL control can terminate power delivery at multiple different times. Thereby, the invention allows independent power levels and independent total power to be delivered to PCE elements in the time domain.

Further, the present invention provides a write system that minimizes power variations relative to BL resistance and capacitance variations. Further, a write system is provided that minimizes power variations relative to the previous state of the PCE. The voltage rise time is different depending on the resistance of the PCE. This in effect is lessened with a pre-charged (BL). Additionally, a write system is provided that allows a multitude of bits to be written at the same time. A write system is provided that allows bits along a selected WL to receive a different magnitude and/or length pulse.

Since the relatively large BL capacitance is already pre-charged, there is no significant delay in the application of the heating power to the cell. Thereby, a high speed write operation with short pulse lengths is advantageous for the final PCE resistance state. One advantage of a high speed write operation is the phase change elements life cycle may be reduced in response to the more energy applied to it overall. It is therefore advantageous to tightly control the energy applied and to apply the minimum power needed in order to switch the cell. The lifetime of a bit can be measured in terms of the number of write and read cycles a cell can undergo. It is therefore advantageous to shorten the write cycle and thereby extend the life of the cell, for example, a 5%, or 10% reduction in the write cycle can expand the life of the cell by an equal amount.

The transition of the phase change element is dependent on being above a specified power level for a predetermined amount of time. The quicker the specified power level is achieved, the quicker the power can be turned off, resulting in a smaller amount of total power applied. For example, if it takes five nanoseconds to raise the temperature of the phase change element above the transition temperature, then the power applied in those first five nanoseconds is expended. However, if it takes only one nanosecond to raise the temperature of the phase change element above the transition temperature, then a speed efficiency is achieved using less power. Also, an advancement in endurance of the PCE cell is achieved because less total power is applied to the PCE cell and PCE, resulting in less stress on the phase change element which will prolong the life of the cell and PCE.

The quickest way to achieve a power rise in the PCE cell, is to charge the bit line and turn on the word line. The quickest way to make the power fall in the PCE cell is to disconnect the source and quench the bit line with a shorting device, thereby allowing the charge in the system a lower resistance path to ground rather than continuing to flow through the PCE. The control system according to the present invention enables a quick T2 220 transition, as shown in FIG. 3A.

Figure 3A:
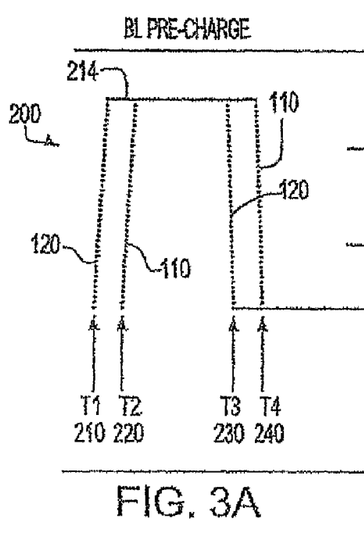
FIG. 3A is a time sequence diagram of the control system pulse output with a BE pre-charge according to the present invention.
Figure 4A:
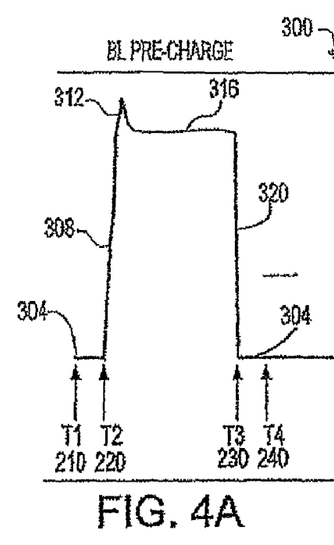
FIG. 4A is a time sequence diagram of the PCE power resulting from the control system pulse shown in FIG. 3A.

Operation of the optimized phase change write control system 10 can be seen in FIG. 3 which depicts the control system 10 pulse output, and where FIG. 4 depicts the resulting PCE cell power signal. Referring to FIG. 3A, in the optimized control system pulse train 200, at T1 210 (FIGS. 3 & 4), the BL path opens (voltage is applied to the bit line) and begins to charge to a pre-set level 214. The bit line 120 is activated first T1 210 and then the word line 110 is activated at T2 220. At T3 230 the bit line 120 is brought down first and then the word line 110 is brought down at T4 240.

Figure 3B:
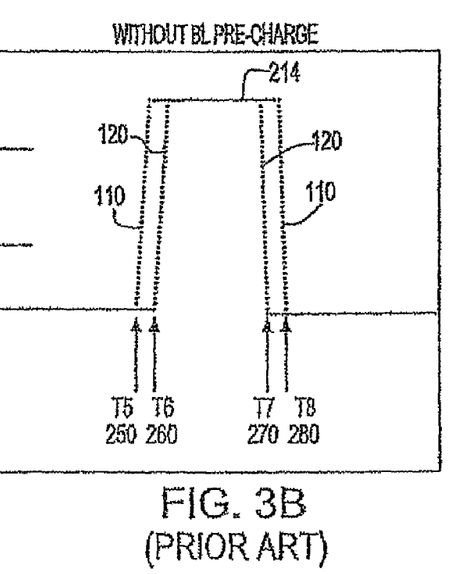
FIG. 3B is a time sequence diagram of the control system pulse output without a BL pre-charge according to the prior art.

In FIG. 3B, a prior art pulse output without the pre-charge is shown where the word line is activated at T5 250 in contradistinction to the bit line being activated first in FIG. 3A. As shown in FIG. 3B, the bit line 120 is activated at T6 260. Thus, in FIG. 3A, with the pre-charge according to the present invention, the bit line 120 is activated first at T1 210, in the prior art example shown in FIG. 3b, the word line 110 is activated first at T5 250. Referring to FIG. 3B, at T7 270 the bit line 120 is brought down first and then the word line 110 is brought down at T8 280.

Additionally, charging can be done on multiple bit lines and each bit line could be pre-charged to a different level. At T2 220, (FIGS. 3 & 4) the WL 110 path opens (voltage is applied to the word line) by opening the access transistor 130 (FIG. 2A) in series with the PCE 144 thus selecting the PCE element. At T2 220 the pre-charge is complete and power is delivered to the cell via the word line 110 (FIG. 2). At T3 230, the BL path is closed (voltage is turned off) and a discharge transistor attached independently to each bit line is turned on to remove any charge from the bit line. The time point T3 230 can be different for each BL. At T4 240, the voltage is turned off at the word line.

Without the BL pre-charge, the word line 110 is opened first at T5 250 as shown in FIG. 3B, and then the bit line 120 is opened at T6 260. The voltage level 214 is reached first by the word line in contradistinction to the BL pre-charge scenario show in FIG. 3A. At T6 260 the bit line reaches the voltage level 214. At T7 270 the BL 120 path is closed and at T8 280, the WL 110 voltage is turned off.

Figure 4B:
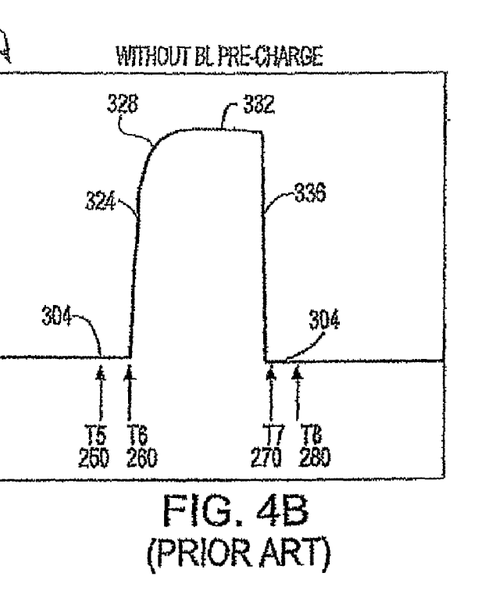
FIG. 4B is a time sequence diagram according to the prior art of the PCE power resulting from the prior art control system pulse shown in FIG. 3B.

Referring to FIGS. 4A and 4B, a chart depicting power in relation to the bit line 120 and word line 110 charging shown in FIG. 3 is shown in FIGS. 4A and 4B. At T1 210 in FIG. 4A, the voltage level 304 is zero while the bit line 120 is pre-charged. At T2 220 when the word line 110 is activated, the voltage is initiated 308. A power surge 312 occurs and then the voltage level 316 stabilizes. When the bit line 120 is turned off at T3 230, the voltage returns to zero, and the word line 110 is turned off at T4 240. Without the BL pre-charge, as in the prior art shown in FIG. 4B, the word line 110 is initiated at T5 250 and the voltage 304 is zero. When the bit line 120 is initiated at T6 260, the voltage is initiated 324 and gradually levels off as shown by the curve at 328 and 332 reaching a specified voltage level. When the bit line 120 is turn off at T7 270, the voltage returns to zero 304 and the word line 110 is turned off at T9 280.

Figure 5:
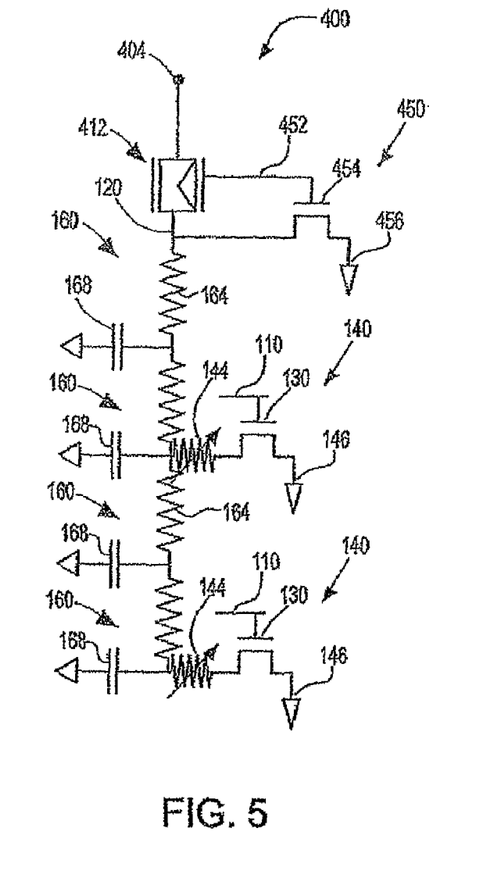
FIG. 5 is a schematic diagram of an example portion of the array shown in FIGS. 1 and 2.

Referring to FIG. 5, a sample of a portion of an embodiment of an array of PCEs 140 and parasitic elements 160 is shown. It is envisioned that an interrelated plurality of such elements comprise the array 100. A transfer gate 412 connects the bit line 120 with the MBL at node 404. An n-channel field effect transistor NFET) quench device 450 includes a gate coupled inversely to the control signals of the transfer gate. The NFET quench device includes an access transistor 454 connected to the BL 120 and to ground 456. The column system decoder 18 (shown in FIG. 1) controls the NFET quench device 450 and the transfer gate 412, and connects the MBL to the write source. The column system decoder 18 initiates the transfer gate 412 opening to connect and closing to disconnect the MBL at 404 to the BL 120, and to connect the MBL to the BL 120. When the transfer gate 412 is open, the NFET 450 is closed, and conversely, when the transfer gate 412 is closed, the NFET 450 is open. When the transfer gate 412 is open, the bit line 120 is pre-charged to the level of the MBL as per the write source. A word line 110 signal may then complete the path to ground through the PCEs 140. The parasitic elements 160 are along the bit line.

Figure 6:
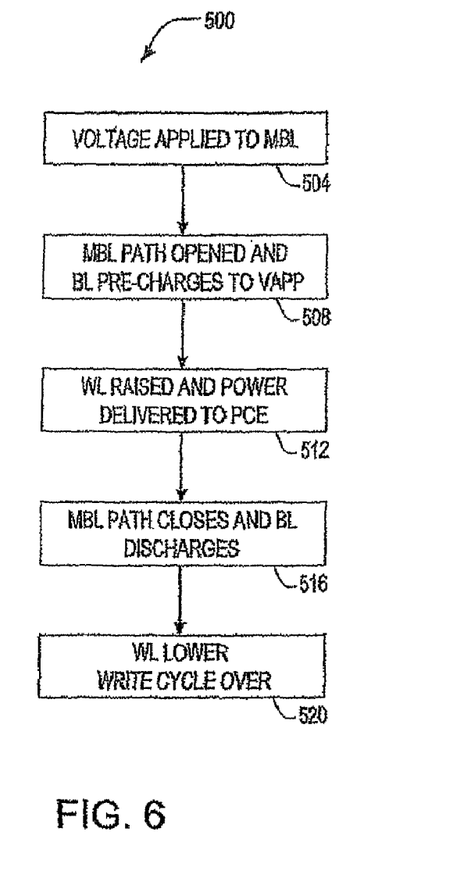
FIG. 6 is a flow chart of the steps for writing to a PCRAM memory cell according to an embodiment of the invention.

Referring to FIG. 6, a flow chart 500 of the writing method according to the present invention begins in step 504 by the column system decoder 18 connecting the MBL to the write source, and initiating the voltage from the MBL to the DL 120 using transfer gate 412 (shown in FIG. 5). The BL 120 pre-charges in step 508 to a specified voltage Vapp corresponding to the BL pre-charge voltage 214 at T1 210 shown in FIG. 3A. The WL 110 is initiated with power in step 512 which is delivered to the PCE 140, as shown at T2 220 in FIG. 3A, and shown in FIG. 5 as PCE 140. When the column system decoder 18 closes the MBL 120 in step 516, the BL 120 discharges at T3 230 in FIG. 3A. The DL 120 is quenched automatically by the NFET quench device 450 when the transfer gate 412 is closed. The WL 110 is then lowered in step 520 and the write cycle is complete as shown at T4 240 in FIG. 3A.

Figure 7:
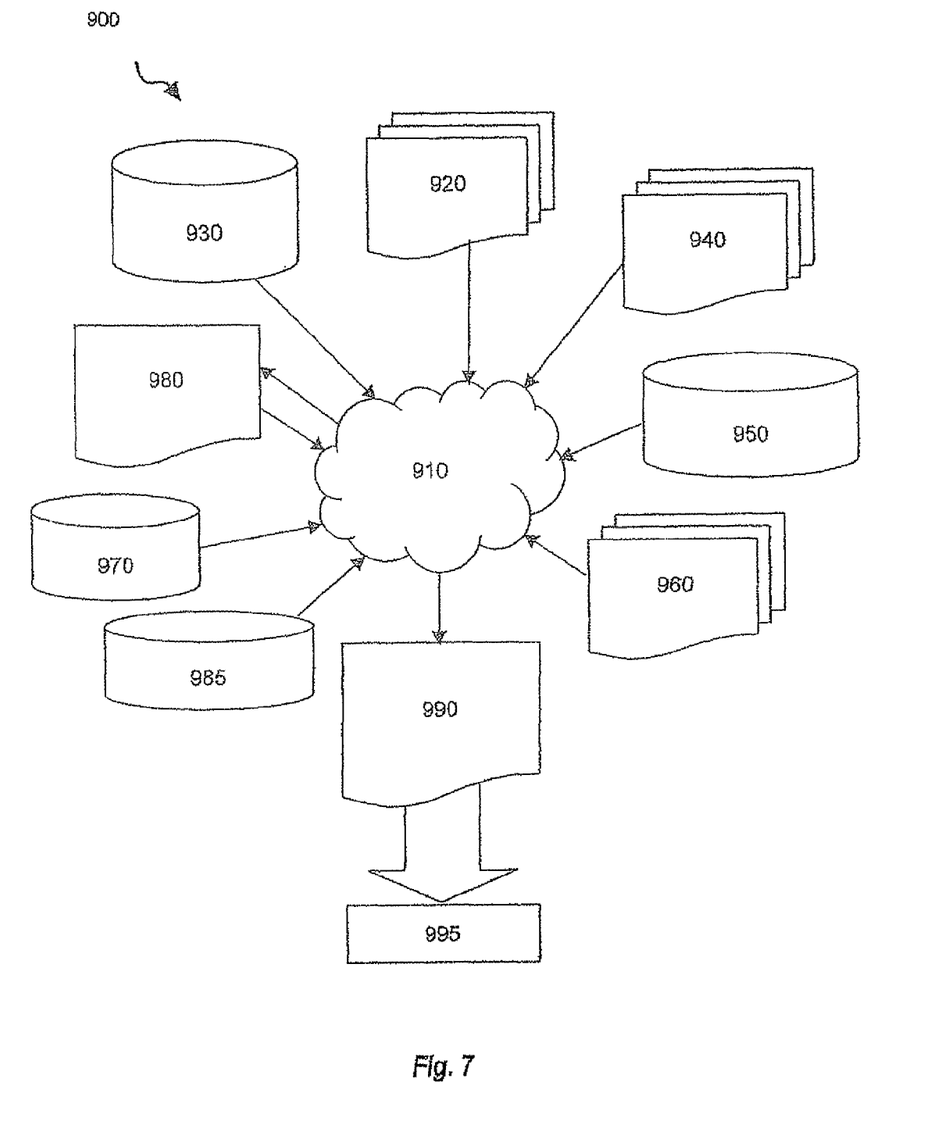
FIG. 7 is a flow diagram of a design process used in semiconductor designing, manufacturing and/or testing.

FIG. 7 shows a block diagram of an example design flow 900. Design flow 900 may vary depending on the type of IC being designed. For example, a design flow 900 for building an application specific IC (ASIC) may differ from a design flow 900 for designating a standard component. Design structure 920 is preferably an input to a design process 910 and may come from an IP provider, core developer, or other design company, or may be generated by the operator of the design flow, or from other sources. Design structure 920 comprises the optimized phase change write control system 10 (FIG. 1) in the form of schematics or HDL, a hardware-description language (e.g., Verilog, VHDL, C, etc.). Design structure 920 may be a text file or a graphical representation of the optimized phase change write control system 10. Design process 910 preferably synthesizes (or translates) the optimized phase change write control system 10 into a netlist 980, where netlist 980 is, for example, a list of wires, transistors, logic gates, control circuits, I/O, models, etc. that describes the connections to other elements and circuits in an integrated circuit design and recorded on at least one of machine readable medium. This may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations for a given manufacturing technology (e.g., different technology nodes, 32 nm, 45 nm, 90 nm, etc.), design specifications 940, characterization data 950, verification data 960, design specifications 970, and test data files 985 (which may include test patterns and other testing information). Design process 910 may further include, for example, standard circuit design processes such as timing analysis, verification, design rule checking, place and route operations, etc. One of ordinary skill in the art of IC design can appreciate the extent of possible electronic design automation tools and applications used in design process 910 without deviating from the scope and spirit of the invention. The design structure of the invention is not limited to any specific design flow.

Design process 910 preferably translates an embodiment of the invention, as shown in FIG. 1, along with any additional integrated circuit design or data into a second design structure 990. Design structure 990 resides on a storage medium in a data format used for the exchange of layout data of integrated circuits (e.g., information stored in a GDSII (GDS2), GL1, OASIS, or any other suitable format for storing such design structures). Design structure 990 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention, as shown in FIG. 1. Design structure 990 may then proceed to a stage 995 where, for example, design structure 990: proceeds to tape-out, is released to manufacturing, is released to a mask house, is sent to another design house, is sent back to the customer, etc.

While the present invention has been particularly shown and described with respect to preferred embodiments thereof, it will be understood by those skilled in the art that changes in forms and details may be made without departing from the spirit and scope of the present application. It is therefore intended that the present invention not be limited to the exact forms and details described and illustrated herein, but falls within the scope of the appended claims.

The invention claimed is:

1. A machine readable storage medium embodying a design structure for a device including a write control system configured to write data on phase change element (PCE) cells during a write cycle, the design structure comprising:
   first data representing an array of phase change element (PCE) cells each including a variable resistor, and a plurality of devices providing independent control of a row access and a column access to the PCRAM;
   second data representing a voltage source coupled to the PCRAM; and
   third data representing an integrated circuit (IC) directing, during a write cycle, the voltage source to pre-charge a column line to a predetermined level and subsequently enabling, during said write cycle, a current flow to a corresponding selected phase change element to write data into said PCE cells,
   wherein a machine reading the design structure causes the IC to initiate a current flow in the phase change element with a row line (word line) once the column line (bit line) has been pre-charged to write data to the PCRAM cell during said write cycle, and the machine reading the design structure causes the IC to terminate the current flow in the phase change element by disconnecting the column line during said write cycle.

2. The machine readable storage medium of claim 1, wherein the machine reading the design structure causes said array of PCE cells to enable quenching the column line (bit line) nearly at a same time as the disconnecting of the column line during said write cycle.

3. The machine readable storage medium of claim 2, wherein the IC includes a control element for directing the voltage source and the current flow, and wherein said design structure further includes:
   fourth data representing a column system decoder for controlling the current flow to the corresponding selected phase change element; and
   fifth data representing a row system element for controlling the current flow in the phase change element with the row (word line) once the column (bit line) has been pre-charged to write data to the PCRAM cell.

4. A machine readable storage medium embodying a design structure for a device including a write control system configured to write data on phase change element (PCE) cells during a write cycle, the design structure comprising:
   first data representing an array of phase change element (PCE) cells each including a variable resistor, and a plurality of devices providing independent control of a row access and a column access to the PCRAM, wherein the PCEs each include a variable resistor and an access transistor;
   second data representing a voltage source coupled to the PCRAM; and
   third data representing an integrated circuit (IC) directing, during a write cycle, the voltage source to pre-charge a column line to a predetermined level and subsequently enabling, during said write cycle, a current flow to a corresponding selected phase change element to write data into said PCE cells,
   wherein a machine reading the design structure causes the voltage source to pre-charge a plurality of column lines to multiple independent levels for each column line during said write cycle, and the machine reading the design structure causes the IC to terminate the current flow in a plurality of phase change elements independently for each column during said write cycle, and the machine reading the design structure causes the IC to initiate a current flow in the phase change element with a row line (word line) once the column (bit line) has been pre-charged to write data to the PCRAM cell during said write cycle, and the machine reading the design structure causes the IC to terminate the current flow in the phase change element by disconnecting the column line during said write cycle; and
   wherein the IC includes a control element for directing the voltage source and current flow, a column system decoder for controlling the current flow to the corresponding selected phase change element, and a row system element for controlling the current flow in the phase change element with the row (word line) once the column (bit line) has been pre-charged to write data to the PCRAM cell.

5. The machine readable storage medium of claim 4 further including another data representing a parasitic element communicating with the array of PCE cells and the parasitic element including a capacitance.

6. A machine configured to read from a machine readable storage medium embodying a design structure for a device including a write control system configured to write data on phase change element (PCE) cells during a write cycle, the design structure comprising:
   first data representing an array of phase change element (PCE) cells each including a variable resistor, and a plurality of devices providing independent control of a row access and a column access to the PCRAM;
   second data representing a voltage source coupled to the PCRAM; and
   third data representing an integrated circuit (IC) directing, during a write cycle, the voltage source to pre-charge a column line to a predetermined level and subsequently enabling, during said write cycle, a current flow to a corresponding selected phase change element to write data into said PCE cells,
   wherein the machine, upon reading the design structure, causes the IC to initiate a current flow in the phase change element with a row line (word line) once the column line (bit line) has been pre-charged to write data to the PCRAM cell during said write cycle, and the machine, upon reading the design structure, causes the IC to terminate the current flow in the phase change element by disconnecting the column line during said write cycle.

7. The machine of claim 6, wherein the machine, upon reading the design structure, causes said array of PCE cells to enable quenching the column line (bit line) nearly at a same time as the disconnecting of the column line during said write cycle.

8. The machine of claim 7, wherein the IC includes a control element for directing the voltage source and the current flow, and wherein said design structure further includes:
   fourth data representing a column system decoder for controlling the current flow to the corresponding selected phase change element; and
   fifth data representing a row system element for controlling the current flow in the phase change element with the row (word line) once the column (bit line) has been pre-charged to write data to the PCRAM cell.

9. The machine of claim 6, wherein the machine, upon reading the design structure, causes the voltage source to pre-charge a plurality of column lines to multiple independent levels for each column line, and the machine, upon reading the design structure during said write cycle, causes the IC to terminate the current flow in a plurality of phase change elements independently for each column during said write cycle, and wherein the IC includes a control element for directing the voltage source and current flow, a column system decoder for controlling the current flow to the corresponding selected phase change element, and a row system element for controlling the current flow in the phase change element with the row (word line) once the column (bit line) has been pre-charged to write data to the PCRAM cell.

10. The machine of claim 9 further including another data representing a parasitic element communicating with the array of PCE cells and the parasitic element including a capacitance.

* * * * *